United States Patent
Gardner et al.

(10) Patent No.: US 6,169,306 B1
(45) Date of Patent: Jan. 2, 2001

(54) SEMICONDUCTOR DEVICES COMPRISED OF ONE OR MORE EPITAXIAL LAYERS

(75) Inventors: Mark I. Gardner, Cedar Creek; Mark C. Gilmer, Austin, both of TX (US)

(73) Assignee: Advanced Micro Devices, Inc., Austin, TX (US)

(*) Notice: Under 35 U.S.C. 154(b), the term of this patent shall be extended for 0 days.

(21) Appl. No.: 09/122,833

(22) Filed: Jul. 27, 1998

(51) Int. Cl.$^7$ ................................................ H01L 27/108
(52) U.S. Cl. .................... 257/310; 257/314; 257/321; 257/410
(58) Field of Search .................... 257/314, 315, 257/321, 410, 310

(56) References Cited

U.S. PATENT DOCUMENTS

| | | | |
|---|---|---|---|
| 4,115,914 | * | 9/1978 | Harari .................................... 29/571 |
| 5,126,805 | * | 6/1992 | Bulat et al. .......................... 257/134 |
| 5,656,837 | * | 8/1997 | Lancaster et al. .................... 257/314 |
| 5,744,374 | * | 4/1998 | Moon ...................................... 438/3 |
| 5,834,793 | * | 11/1998 | Shibata .................................. 257/25 |
| 6,054,355 | * | 4/2000 | Inumiya et al. ...................... 438/296 |

OTHER PUBLICATIONS

V. A. Rozhkov et al., Electrical And Photoelectrical Properties Of MIS Structures With Rare Earth Oxide Films as Insulator, IEEE 5th International Conference on Conduction and Breakdown in Solid Dielectrics, pp. 552–555, 1995.

M. Y. Sung et al., Electrical Characteristics of Metal–Al2O3–Si Structure Depositied by ICBE Technique for Application of Semiconductor of Device Fabrication, IEEE Electronic Components and Technology Conference Proceedings, 45th, pp. 786–792, 1995.

L. Manchanda et al., Yttrium Oxide/Silicon Dioxide: A New Dielectric Structure for VLSI/ULSI Circuits, IEEE Electron Device Letters, vol. 9 4, pp. 180–182, Apr. 1998.

L. Manchanda et al., Gate Quality Doped High K Films for CMOS Beyond 100nm: 3–10 nm Al2O3 with Low Leakage and Low Interface States, IEEE Electron Devices Meeting, IEDM '98 Technical Digest, International, pp. 60–08, Dec. 1998.

* cited by examiner

Primary Examiner—Mahshid Saadat
Assistant Examiner—George C. Eckert, II
(74) Attorney, Agent, or Firm—Williams, Morgan & Amerson

(57) ABSTRACT

The present invention is directed to a novel semiconductor device and a method for making same. As disclosed herein, a gate dielectric comprised of epitaxial metal oxide is positioned above a semiconducting substrate. A gate conductor comprised of an epitaxial conductive material is positioned above the gate dielectric. The method comprises forming a layer of an epitaxial metal oxide above a semiconducting substrate, forming a layer of epitaxial conductive material above the layer of epitaxial metal oxide, and forming a source/drain region.

44 Claims, 6 Drawing Sheets

SEMICONDUCTOR DEVICES COMPRISED OF ONE OR MORE EPITAXIAL LAYERS

BACKGROUND OF THE INVENTION

1. Field of the Invention

The present invention is generally directed to semiconductor devices, and, more particularly, to a structure for semiconductor devices and method for making same.

2. Description of the Related Art

There is a constant drive within the semiconductor industry to improve the performance of various semiconductor devices. Moreover, there is a constant drive to reduce the feature size, or scale, of the semiconductor devices. However, such scaling also leads to several problems. For example, as the thickness of traditional silicon dioxide gate dielectric layers is reduced, the ability of the silicon dioxide to perform its functions, e.g., prevent current leakage, may become impaired. Additionally, as such silicon dioxide gate dielectric layers are reduced in size, they become more difficult to manufacture with an acceptable level of quality and consistency.

For another example, many semiconductor devices employ a non-crystalline material, such as polysilicon, as part of the device, e.g., a polysilicon gate electrode for a field effect transistor, a polysilicon floating gate for a memory device, etc. However, given the non-crystalline or amorphous structure of these materials, the performance of various semiconductor devices may be impaired.

Such non-crystalline materials have a relatively large number of grain boundaries as compared to a material having a single crystal structure. As compared to crystalline material, the relatively large number of grain boundaries act to slow down the flow of electrons through, for example, the gate conductor of a field effect transistor. Also, use of such amorphous materials as, for example, a floating gate on a memory device, may reduce the ability of the floating gate to hold a charge. This is because there are fewer sites available within the non-crystalline material to hold electrons as compared to crystalline material.

There is also a constant drive in the semiconductor industry to reduce the number of process steps required to manufacture various types of semiconductor devices. Generally, the fewer process steps involved in manufacturing a semiconductor device, the lower the cost of manufacturing and the shorter the time required to manufacture the device. Additionally, it is desirable to reduce the number of times a given wafer, or lot of wafers, has to be moved from one piece of processing equipment to another piece of processing equipment. Reducing the number of times a wafer, or lot of wafers, is moved between processing equipment is desirable in that it will reduce the number of times the wafers are being handled by factory workers, reduce the number of opportunities for exposing the wafer to contaminants, and may reduce the time required to fabricate the completed semiconductor device, etc.

The present invention is directed to a semiconductor device that minimizes or reduces some or all of the aforementioned problems and a method for making same.

SUMMARY OF THE INVENTION

The present invention is directed to a novel semiconductor device. The device comprises a semiconducting substrate and a first layer of epitaxial metal oxide positioned above the substrate. The device further comprises a gate conductor positioned above the layer of epitaxial metal oxide and at least one source/drain region.

The present invention also includes a novel method of making semiconductor devices. The method comprises forming a layer of epitaxial metal oxide above a semiconducting substrate and forming a layer of conductive material above the layer of epitaxial metal oxide. The method further comprises removing portions of the layer of epitaxial metal oxide and the layer of conductive material and forming at least one source/drain region.

The method further comprises forming different types of semiconductor devices above a semiconducting substrate. In one embodiment, the method comprises forming a first layer of epitaxial metal oxide above a semiconducting substrate, forming a second layer of epitaxial conductive material above the first layer, forming a third layer of epitaxial metal oxide above the second layer, and forming a fourth layer of conductive material above the third layer. The method further comprises removing the third and fourth layers in at least some of a plurality of first regions of the wafer where a first type of semiconductor device is to be formed, removing portions of the first and second layers in said first regions of the wafer to define a portion of the first type of semiconductor devices, and removing portions of the first, second, third and fourth layers in at least some of a plurality of second regions of the wafer where a second type of semiconductor device is to be formed.

BRIEF DESCRIPTION OF THE DRAWINGS

The invention may be understood by reference to the following description taken in conjunction with the accompanying drawings, in which like reference numerals identify like elements, and in which.

Figure 1:
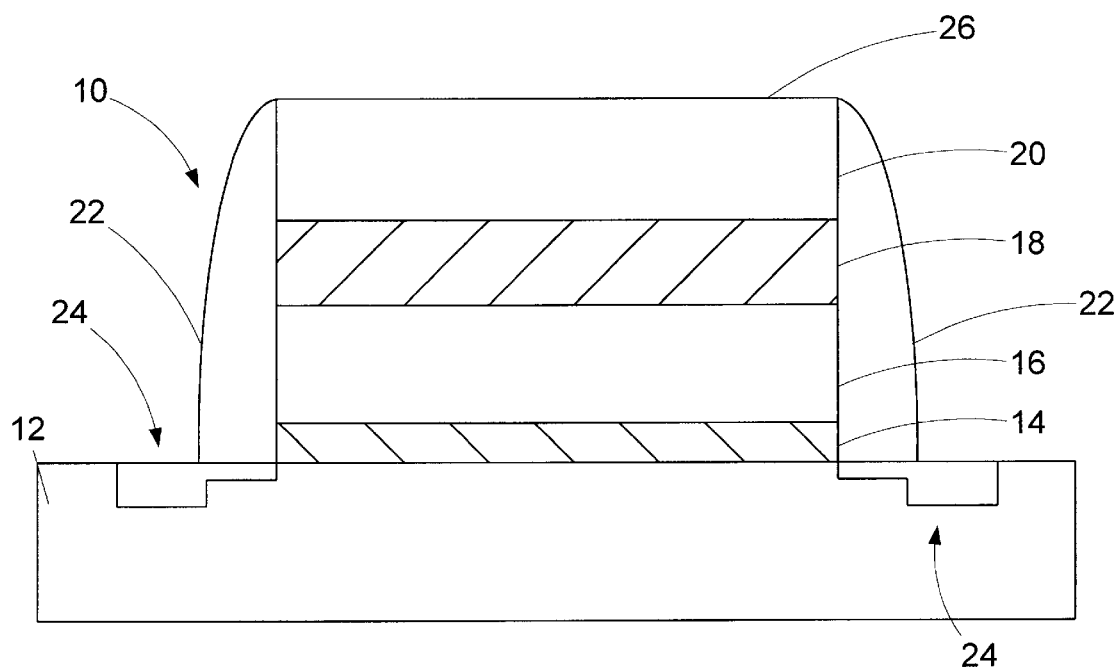
FIG. 1 is a cross-sectional, schematic view of a semiconductor device of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached drawings. The present invention may be used to construct a variety of semiconductor devices, e.g., transistors, memory devices, logic devices, etc., employing different technologies, such as PMOS, NMOS and CMOS, etc. As shown in FIG. 1, an illustrative semiconductor device, memory device 10, is comprised of a semiconducting substrate 12, a gate dielectric 14, a gate conductor 16, a tunnel dielectric 18, and a floating gate 20. The memory device 10 may further be comprised of a plurality of sidewall spacers 22 and source/drain regions 24. Of course, as is readily recognized by those skilled in the art, an epitaxial layer of silicon (not shown) may be formed on the substrate 12.

In one embodiment, the substrate 12 may be comprised of silicon. The gate dielectric 14 and the tunnel dielectric 18 may be comprised of an epitaxial metal oxide, such as epitaxial aluminum oxide ($Al_2O_3$) and epitaxial yttrium sesquioxide ($Y_2O_3$), etc. In one illustrative embodiment, the gate dielectric 14 and the tunnel dielectric 18 may be comprised of epitaxial aluminum oxide ($Al_2O_3$) having a thickness ranging from approximately 10–30 Å and 30–100 Å, respectively. The gate conductor 16 and the floating gate 20 may be comprised of an epitaxial conductor (doped or undoped), such as epitaxial silicon (doped or undoped), or an epitaxial germanium, etc. In one embodiment, the gate conductor 16 and the floating gate 20 may be comprised of epitaxial silicon (doped or undoped) that may each have a thickness ranging from approximately 500–2000 Å. For purposes of this disclosure, the use of the term "epitaxial" refers to the approximate single crystalline structure of the layer or film. Of course, no material has a perfect single crystal structure, and such layers may have defects and contaminants as are commonly encountered in the formation of epitaxial layers in modern semiconductor processing.

The sidewall spacers 22 may be comprised of a variety of materials, such as silicon dioxide or silicon nitride. The sidewall spacers 22 act to seal the gate dielectric 14, gate conductor 16, tunnel dielectric 18 and floating gate 20. In one embodiment, the sidewall spacers 22 should have a minimum thickness of approximately 40 Å. Of course, the thickness of the sidewall spacers 22 may be naturally reduced below this minimum value at the region where the sidewall spacers 22 near the top surface 26 of the floating gate 20. The source/drain regions 24 may be of any construction commonly employed in the manufacture of source/drain regions, e.g., a lightly doped drain structure. Of course, those skilled in the art will recognize that the source/drain regions 24, as well as the gate conductor 16 and the floating gate 20, may be doped with an appropriate $N^+$ or $P^+$ dopant material, e.g., phosphine ($PH_3$), arsine ($AsH_3$), diborane ($B_2H_6$), borontrifluoride ($BF_3$), etc., as dictated by design requirements. The dopant concentration may be varied from, for example, $10^{16}$–$10^{20}$ atoms/cm$^3$.

Figure 2:
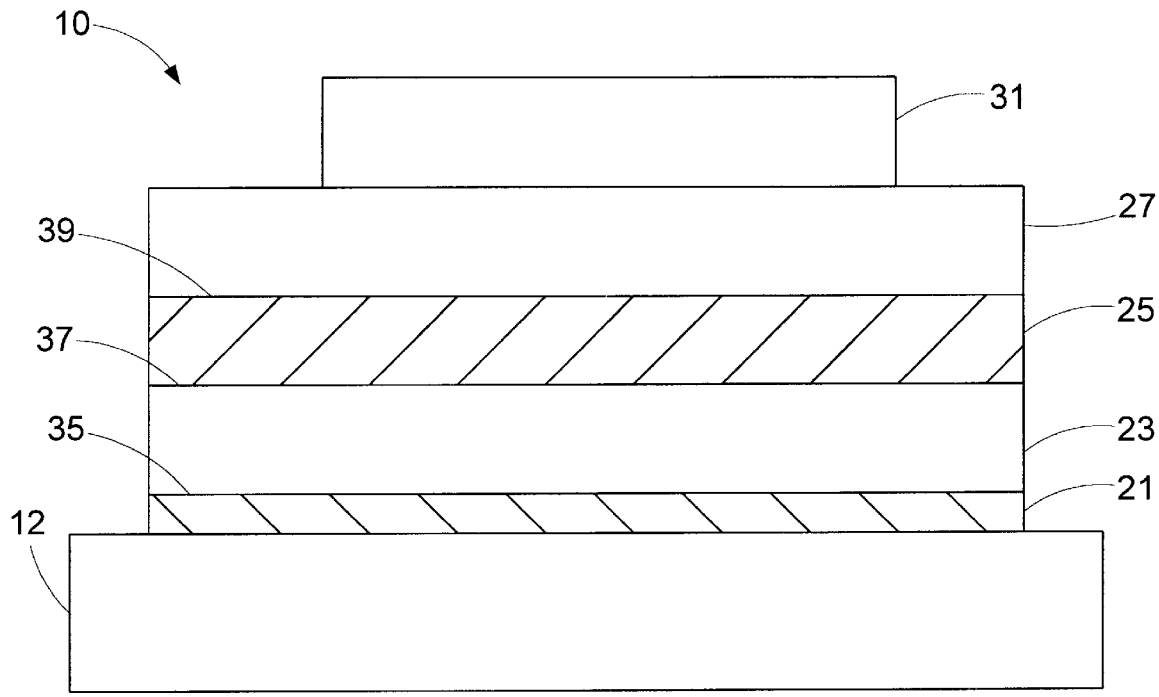
FIG. 2 is a cross-sectional, schematic view of multiple process layers formed above a semiconducting substrate.

The present invention is also directed to a method for forming a variety of semiconductor devices, such as field effect transistors, bi-polar transistors, memory devices, logic devices, etc. The method will now be explained with reference to FIGS. 2 and 3 with respect to the manufacture of an illustrative semiconductor device, e.g., a memory device 10. Using the inventive method disclosed herein, a semiconductor device, such as the memory device 10 shown in FIG. 1 may be, if desired, substantially manufactured in a single piece of processing equipment, e.g., an epi reactor or a chemical vapor deposition ("CVD") apparatus. In general, as shown in FIG. 2, a first epitaxial metal oxide layer 21, comprised of materials such as those disclosed above, may be formed above the substrate 12. Thereafter, a first epitaxial conductor layer 23, comprised of materials such as those disclosed above, may be formed above the first epitaxial metal oxide layer 21. The process may continue with the formation of a second epitaxial metal oxide layer 25, comprised of materials such as those disclosed above, above the first epitaxial conductor layer 23, and the formation of a second epitaxial conductor layer 27, comprised of materials such as those disclosed above, above the second epitaxial metal oxide layer 25. In one illustrative embodiment, the layers 21 and 25 may be comprised of epitaxial aluminum oxide and the layers 23 and 27 may be comprised of epitaxial silicon (doped or undoped).

After formation of the layers 21, 23, 25 and 27, the substrate 12 may be removed from the processing equipment. Using traditional photolithographic equipment, a layer of photoresist 31 may be formed above the layer 27 and patterned to result in the structure shown in FIG. 2. Note that the photoresist layer 31 may be patterned to the final desired width of the memory device 10. The portions of the layers 21, 23, 25 and 27 may then removed by, for example, one or more etching processes to result in the gate stack 33 depicted in FIG. 3 (the photoresist layer 31 is not shown in FIG. 3). The gate stack 33 is comprised of the gate dielectric 14, gate conductor 16, tunnel dielectric 18, and floating gate 20. Thereafter, the sidewall spacers 22 and source/drain regions 24 may be formed by a variety of techniques (some of which are discussed more fully below) to result in the memory device 10 shown in FIG. 1.

A more detailed description of the processing parameters for formation of the illustrative memory device 10 shown in FIG. 1 will now be provided. In this illustrative example, the gate dielectric 14 and tunnel dielectric 18 may be comprised of epitaxial aluminum oxide, whereas the gate conductor 16 and floating gate 20 may be comprised of silicon (doped or undoped). The substrate 12 may be placed into the processing equipment (not shown) and subjected to a light cleaning with, for example, hydrochloric acid (HCl) to remove any native silicon dioxide that may have formed above the substrate 12 prior to the substrate 12 being inserted into the processing equipment. The light cleaning may be accomplished at a temperature ranging from approximately 600–1000° C., and may last for approximately 10–60 seconds (for a single wafer) or 1–5 minutes (for a batch of 25 wafers).

As shown in FIG. 2, the first layer of epitaxial aluminum oxide 21 may be formed by, for example, growing the layer in an epi reactor, in the presence of aluminum trichloride gas ($AlCl_3$) and oxygen ($O_2$). The process may be performed at a temperature ranging from approximately 600–1000° C. and at a pressure of approximately one atmosphere. The process may last for approximately 10–60 seconds (for a single wafer) or 2–10 minutes (for a batch of 25 wafers). The concentrations of the aluminum trichloride and the oxygen may be varied. For example, the concentration of the aluminum trichloride may range from approximately 60–95% and the oxygen concentration may vary from approximately 5–40%. By way of example, a gas having a concentration of approximately 60% aluminum trichloride and 40% oxygen may be used in growing the first layer of epitaxial aluminum oxide 21 to a thickness of approximately 20 Å. To produce a layer of epitaxial aluminum oxide 21 having a thickness of approximately 10 Å, gas having a concentration of approximately 80% aluminum trichloride and 20% oxygen may be used. In general, all other things being equal, to produce a thinner layer of epitaxial aluminum oxide, a gas with a higher concentration of aluminum trichloride ($AlCl_3$) should be used. Additionally, if it is desired to slow down the reaction process of forming the epitaxial layer of aluminum oxide 21, the pressure in the processing equipment may be reduced to, for example, $10–500 \times 10^{-3}$ Torr. Although not required, after the first layer of aluminum oxide 21 is formed, the surface 35 of the first layer 21 may be cleaned with, for example, hydrochloric acid. If this cleaning step is employed, it may also be used to reduce the thickness of the previouslyformed first layer of aluminum oxide 21.

After the first layer of epitaxial aluminum oxide 21 is formed, the first layer of epitaxial silicon 23 may be formed. Of course, connections to the appropriate gases would have to be established. The first layer of epitaxial silicon 23 may be formed by, for example, growing the layer 23 in the presence of, for example, dichlorosilane ($SiH_2Cl_2$) or silane ($SiH_4$), at a temperature ranging from approximately 800–1000° C. for a period of approximately 10–60 seconds (for a single wafer) or 5–20 minutes (for a batch of 25 wafers). Although not required, the first layer of epitaxial silicon 23 may be formed in the presence of $P^+$ or $N^+$ dopant material. For example, for $N^+$ doping, a gas comprised of approximately 5–20% arsine ($AsH_3$) and 80–95% dichlorosilane ($SiH_2Cl_2$) may be used when forming the layer 23. A gas comprised of approximately 20% arsine and 80% dichlorosilane may be used if it is desired to fully saturate the layer of epitaxial silicon 23 with $N^+$ dopant atoms. Of course, the doping levels may be controlled by varying the composition of the dopant gas used. Similarly, for $P^+$ doping, diborane ($B_2H_6$) or borontrifluoride ($BF_3$), etc., may be used in the same approximate concentrations described above for the $N^+$ dopant material.

After the growth of the first layer of epitaxial silicon 23, appropriate gas connections may be made, and a second layer of epitaxial aluminum oxide 25 may be formed. The second layer of epitaxial aluminum oxide 25 may have a thickness ranging from approximately 30–100 Å, and may be formed using, for example, the gases and concentrations discussed above with respect to the growth of the first layer of epitaxial aluminum oxide 21. However, the processing time to grow the second layer of epitaxial aluminum oxide 25 may range from 30–180 seconds (for a single wafer) to 6–30 minutes (for a batch of 25 wafers) due to the increased thickness of the second layer of epitaxial aluminum oxide 25, as compared to the first layer of epitaxial aluminum oxide 21. After the formation of the second layer of epitaxial aluminum oxide 25, the surface 39 of the layer 25 may be cleaned, if desired, with hydrochloric acid, although it is not required. Additionally, during this cleaning process, if used, the thickness of the second layer of epitaxial aluminum oxide 25 may be reduced.

After the second layer of epitaxial aluminum oxide 25 is formed, a second layer of epitaxial silicon 27 may be grown in the same processing equipment. Again, this would require that the gas mixture supplied to the processing equipment be changed. In one embodiment, the second layer of epitaxial silicon 27 may be grown using dichlorosilane or silane in the concentrations described above with respect to the growing of the first layer of epitaxial silicon 23. Of course, similar to the layer 23, the second layer of epitaxial silicon 27 may be grown in the presence of $P^+$ or $N^+$ dopants using the above-described dopant gases and concentrations.

Figure 3:
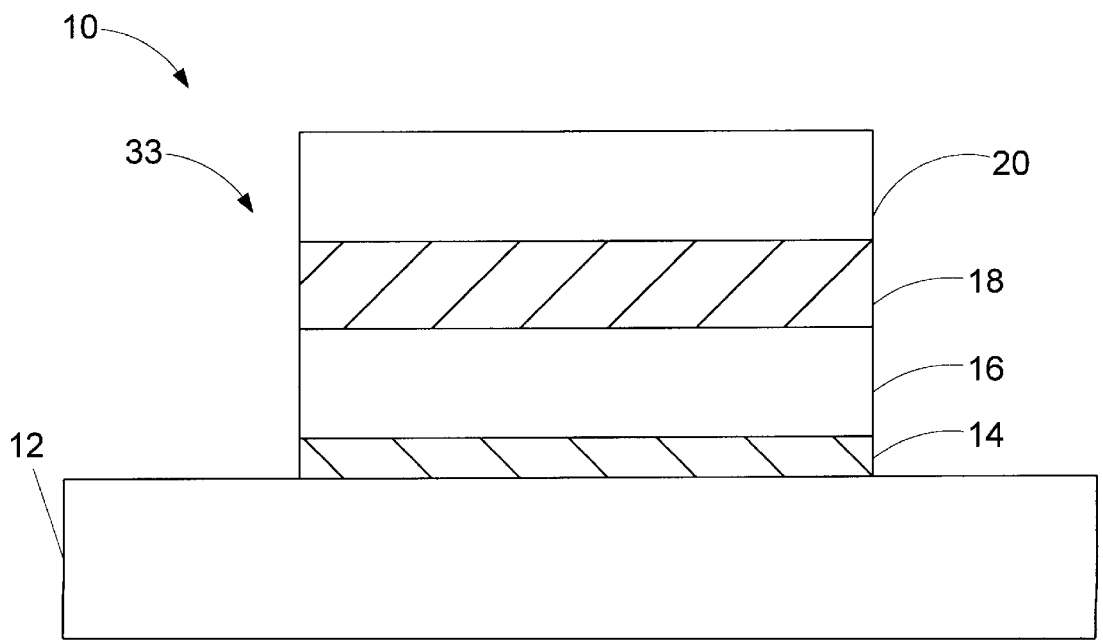
FIG. 3 is a cross-sectional, schematic view of the device shown in FIG. 2 after portions of the process layers have been removed.

As will be readily apparent to those skilled in the art, after the layers 21, 23, 25 and 27 are formed above the substrate 12 (see FIG. 2), the layers 21, 23, 25, 27 may be patterned through use of, for example, a layer of photoresist 31 (see FIG. 2) and one or more etching processes, to result in the gate stack 33 comprised of the gate dielectric 14, the gate conductor 16, the tunnel dielectric 18 and the floating gate 20, as shown in FIGS. 1 and 3. The removal of portions of the layers 21, 23, 25 and 27 may be accomplished by a variety of techniques, for example, multiple plasma or reactive ion etching steps. The layers of epitaxial aluminum oxide 21, 25 may be removed using, for example, $CHF_3$ and $CF_4$ as the etchant gases. The layers of epitaxial silicon 23, 27 may also be removed by using, for example, HBr and $Cl_2$ as the etchant gases. Thereafter, the sidewall spacers 22 may be formed adjacent the gate stack 33. The sidewall spacers 22 may be formed from a variety of materials, for example, silicon dioxide or silicon nitride. The sidewall spacers 22 may be formed by a variety of known techniques, for example, a conformal deposition of silicon dioxide followed by an anisotropic etch of the silicon dioxide, to result in the sidewall spacers 22 depicted in FIG. 1.

Figure 4:
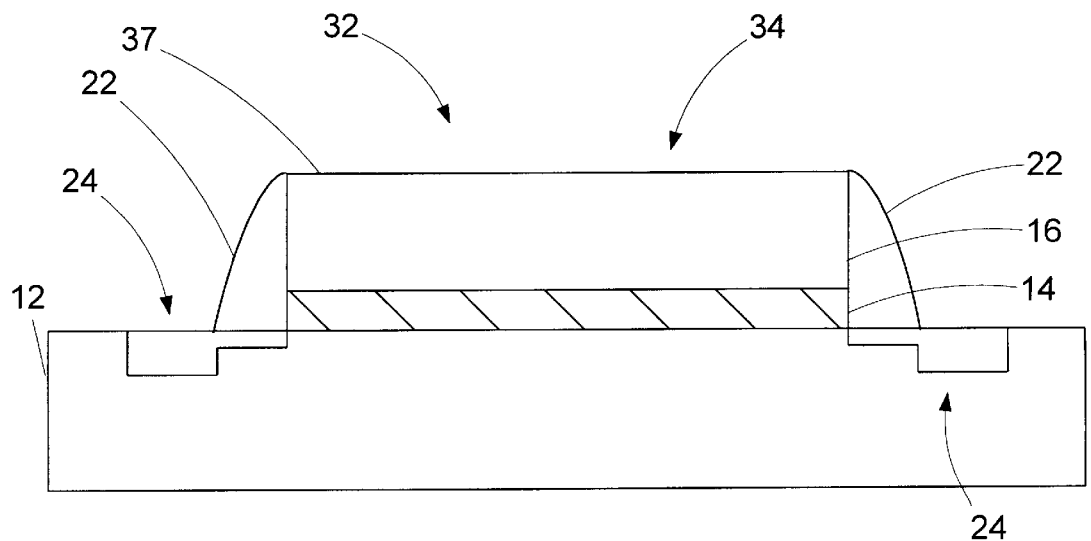
FIG. 4 is a cross-sectional, schematic view of another semiconductor device of the present invention.

Although described in the context of the formation of an illustrative memory device 10 depicted in FIG. 1, those skilled in the art will recognize that the methods disclosed herein may be readily used to form other semiconductor devices, such as, field effect transistors, bi-polar junction transistors, etc. As shown in FIG. 4, the present inventive method may be used to manufacture a novel field effect transistor 32. To produce a field effect transistor 32, the process described above with respect to the formation of the layers 21, 23, 25 and 27 shown in FIG. 2 may be stopped after the first layer of epitaxial aluminum oxide 21 and the first layer of epitaxial silicon 23 (doped or undoped) are formed. A layer of photoresist (not shown) would then be applied above the surface 37 (see FIGS. 2 and 4) of the first layer of epitaxial silicon 23. The photoresist layer may be patterned to the final desired gate width of the transistor 32. Thereafter, the first layer of epitaxial aluminum oxide 21 and the first layer of epitaxial silicon 23 may be removed by, for example, etching, to result in the gate stack 34 (comprised of the gate dielectric 14 and the gate conductor 16) shown in FIG. 4. The sidewall spacers 22 and source/drain regions 24 would then be formed as shown in FIG. 4.

Of course, it is not necessary that the gate conductor 16 shown in FIG. 4 be comprised of an epitaxial conductive layer, e.g., epitaxial silicon. As will be readily apparent to those skilled in the art, the gate conductor 16 shown in FIG. 4 could be comprised of traditional polysilicon (doped or undoped) and still derive some of the benefits of the present invention. However, if the gate conductor 16 were comprised of polysilicon, then it would not be possible to thereafter grow any epitaxial layers above the gate conductor 16 due to the non-crystalline structure of the polysilicon.

As discussed above, the gate dielectric 14 and tunnel dielectric 18 may be comprised of a variety of epitaxial metal oxides, such as those disclosed above. Similarly, the gate conductor 16 and the floating gate 20 may be comprised of a variety of epitaxial conductors, such as those disclosed above. For purposes of illustrating this present aspect of the invention, however, the disclosure will be made in the context of an illustrative memory device 10 having a gate dielectric 14 and tunnel dielectric 18 comprised of epitaxial aluminum oxide and a gate conductor 16 and floating gate 20 comprised of epitaxial silicon (doped or undoped). The illustrative transistor 32 used to disclose this aspect of the invention may have a gate dielectric 14 comprised of epitaxial aluminum oxide and a gate conductor 16 comprised of epitaxial silicon (doped or undoped). Of course, the present method is not to be considered limited to those particular type of devices or the materials from which they are made.

Additionally, the present invention is directed to a novel method of forming different types of circuit devices, e.g., multiple memory devices 10 and multiple transistors 32, above a substrate 12. Using the process disclosed herein, multiple types of semiconductor devices, for example, memory devices 10 and transistor devices 32, may be manufactured in fewer steps and more economically. Those skilled in the art will recognize that a wafer 13 may typically have different types of semiconductor devices, e.g., memory devices, bi-polar transistors, and field effect transistors, etc., formed in random regions over the entire surface of the wafer 13. Moreover, there may be many thousands of each different type of semiconductor device formed on the wafer 13. For purposes of clarity, the novel method for manufacturing multiple types of semiconductor devices on a wafer 13 will be disclosed in the context of manufacturing an illustrative memory device 10 and an illustrative transistor 32. However, those skilled in the art will recognize that the present method is applicable to the mass manufacturing of different types of semiconductor devices across the entire surface of the wafer 13.

Figure 5:
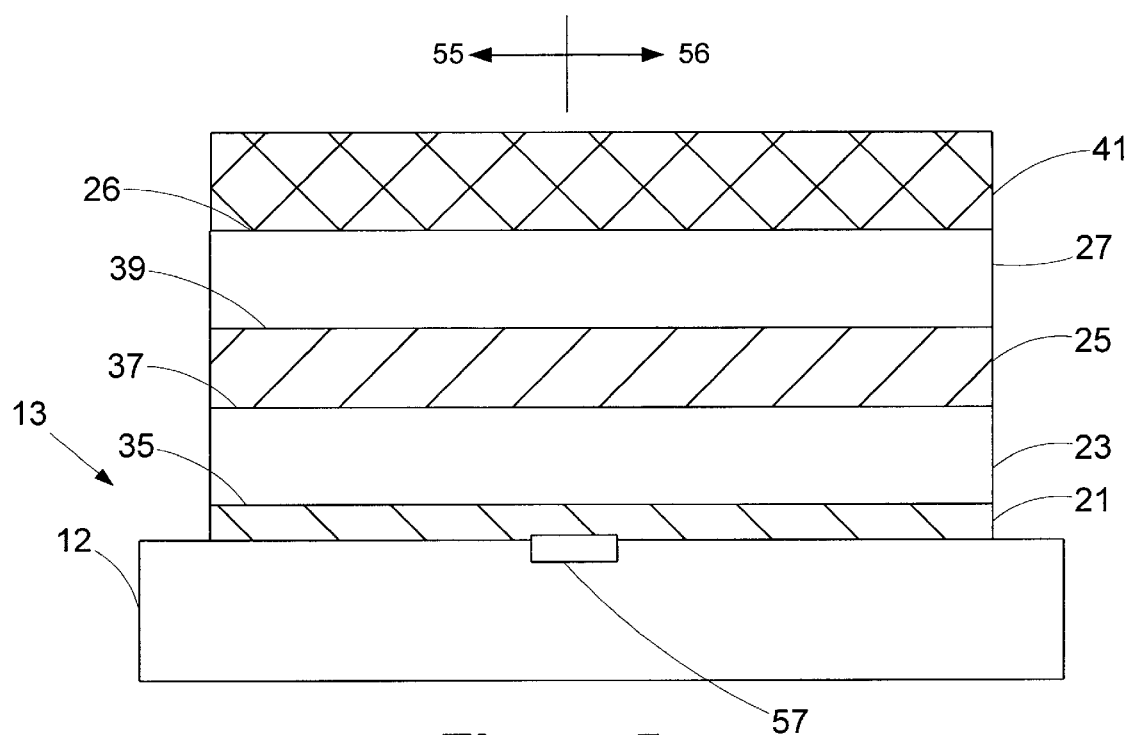
FIG. 5 is a cross-sectional, schematic view of multiple process layers formed above a semiconductor substrate.

As shown in FIG. 5, the wafer 13 may have a region 55, where memory devices 10 are to be formed, and a region 56, where the transistors 32 are to be formed. An isolation 57 of any variety or type, e.g., trench isolation, etc., may be formed on the wafer 13 by any of a variety of known techniques. Those skilled in the art will recognize that the isolation 57 may be used to electrically isolate various semiconductor devices, e.g., memory devices and transistors, etc., formed on the wafer 13.

Figure 6:
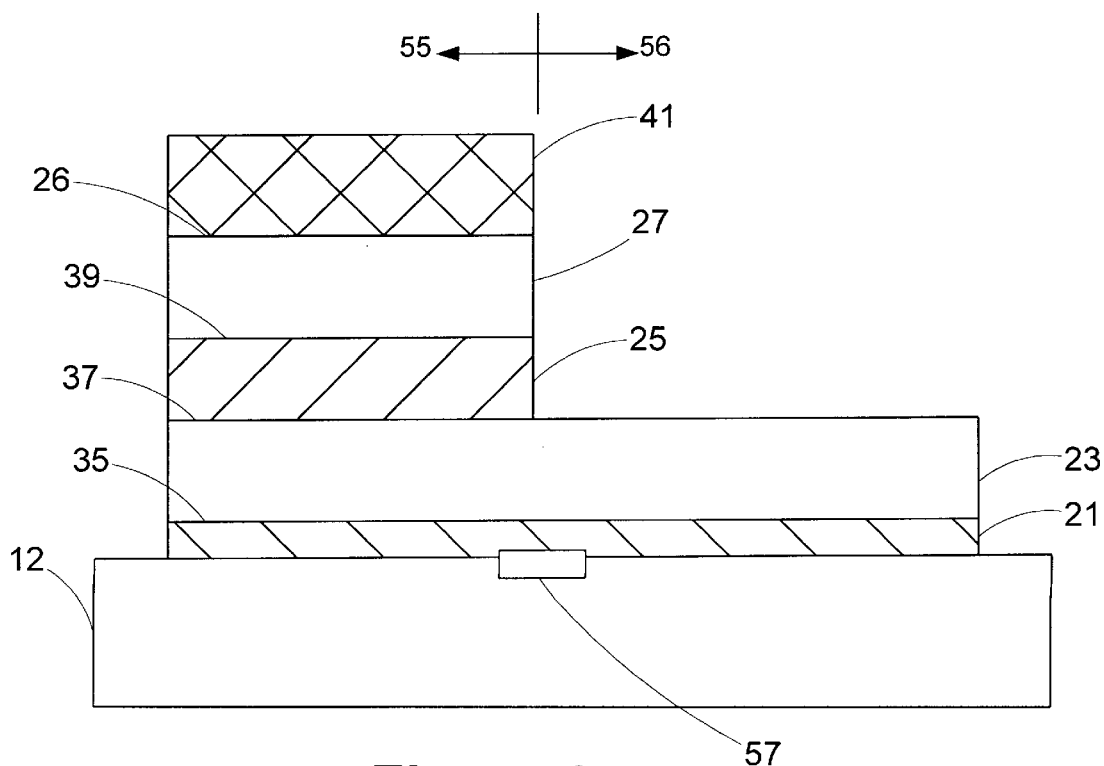
FIG. 6 is a cross-sectional, schematic view of the device shown in FIG. 5 with a portion of some of the process layers removed in certain regions of a wafer.

As shown in FIG. 5, the first layer of epitaxial aluminum oxide 21, the first layer of epitaxial silicon 23, the second layer of epitaxial aluminum oxide 25, and the second layer of epitaxial silicon 27 may be formed above the substrate 12 using the above-described processes. Thereafter, a layer of photoresist 41 may be formed above the surface 26 of the second layer of epitaxial silicon 27. As shown in FIG. 6, the photoresist layer 41 may then be patterned to expose the illustrative region 56 where the transistor 32 is to be formed. Next, portions of the second layer of epitaxial silicon 27 and the second layer of epitaxial aluminum oxide 25 within the region 56 where the transistor 32 is to be formed may then be removed, for example, by etching. These processes result in the structure depicted in FIG. 6.

Figure 7:
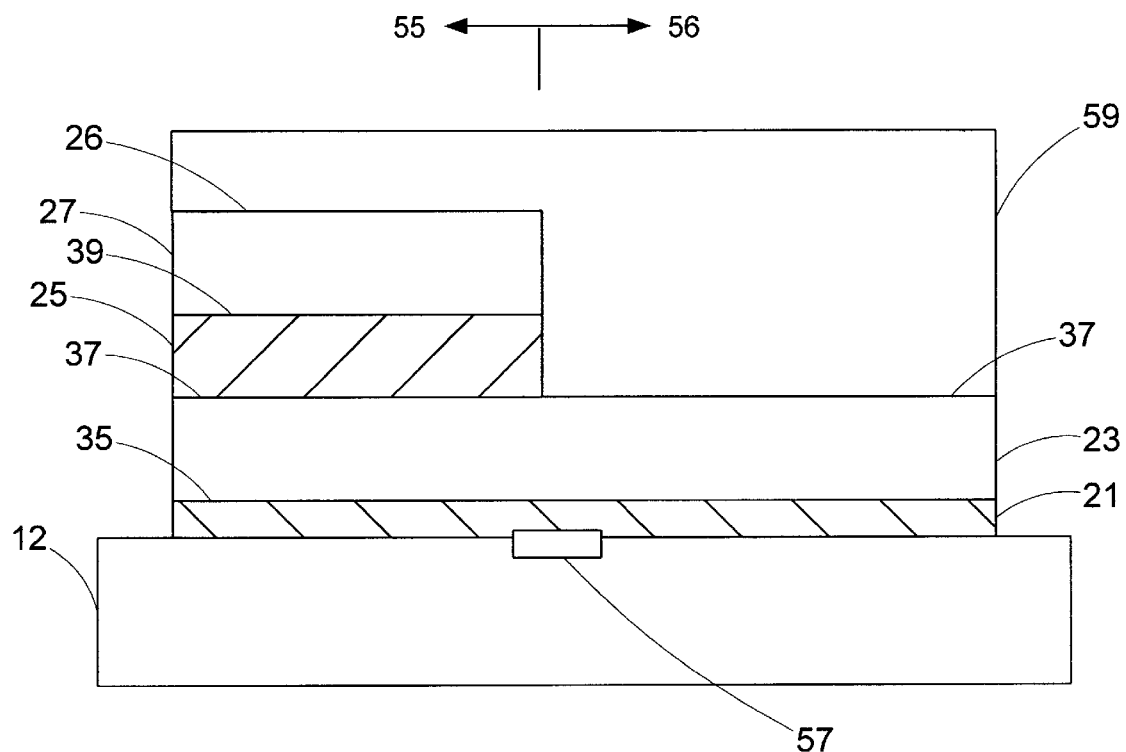
FIG. 7 is a cross-sectional, schematic view of the device shown in FIG. 6 with a conformal layer of photoresist formed thereon.
Figure 8:
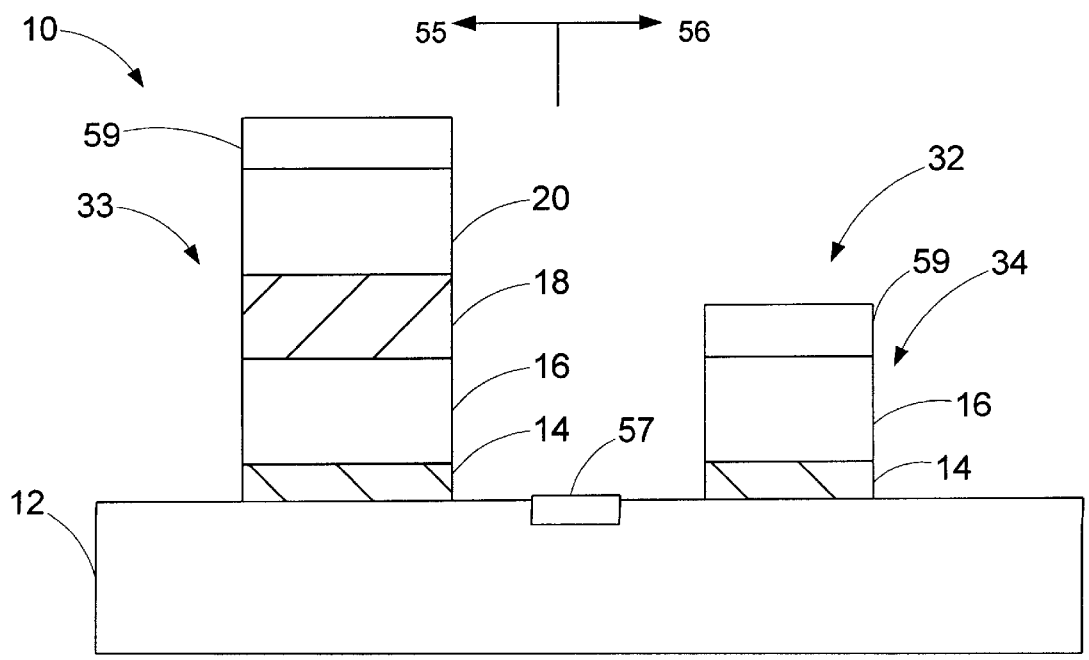
FIG. 8 is a cross-sectional, schematic view of a wafer with multiple partially-formed semiconductor devices positioned thereon.

As shown in FIGS. 6 and 7, the photoresist layer 41 that remains above the surface 26 of the second layer of epitaxial silicon 27 in the memory device region 55 of the wafer may be removed. A new conformal layer of photoresist 59 may then be formed above the surface 26 of the second layer of epitaxial silicon 27 and the surface 37 of the first layer of epitaxial silicon 23, as shown in FIG. 7. The photoresist layer 59 may then be patterned to, for example, the final desired width of the gate structures 33, 34 for the memory device 10 and transistor 32, respectively, as shown in FIG. 8. One or more etching steps may be used to remove portions of the layers 21, 23, 25 and 27 to define the resulting gate structure 33, 34 for the illustrative memory device 10 and transistor 32, respectively, as shown in FIG. 8. Of course, the removal of the portions of the layers 21, 23, 25 or 27 need not be performed at the same time in the memory device region 55 as the layers 21 and 23 are removed in the transistor region 56. However, it is envisioned that, in one embodiment, the method may involve removal of the appropriate portions of the layer 27 in the memory device region 55 and the layer 23 in the transistor region 56 at the same time. Similarly, in one embodiment, the layer 25 in the memory device region 55 and the layer 21 in the transistor region 56 could be removed at the same time. Thereafter, the source/drain regions 24 (not shown) and sidewall spacers 22 (not shown) may be formed adjacent the gate structures 33, 34 in accordance with known techniques.

Figure 9:
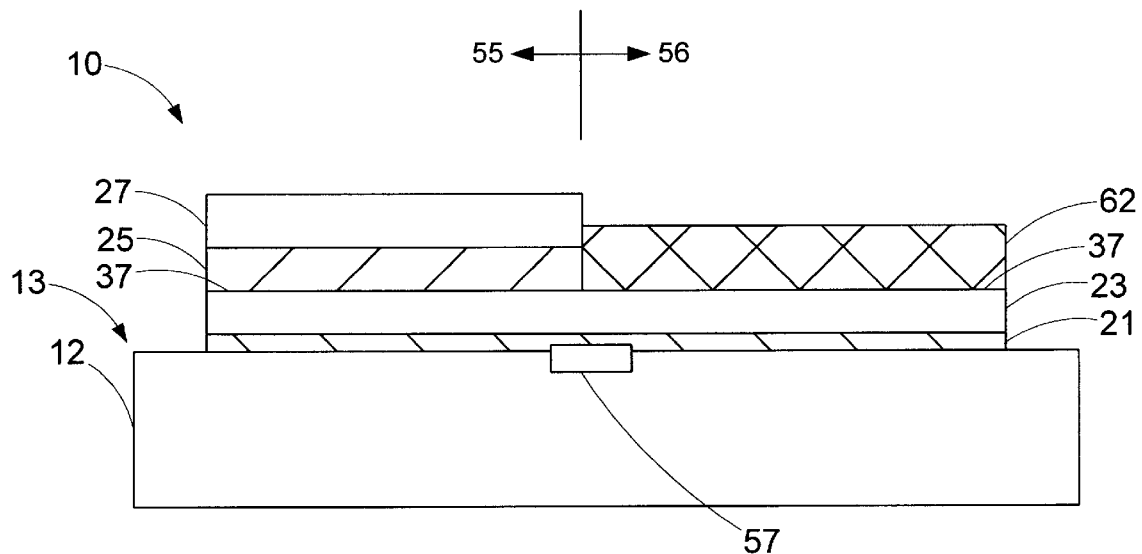
FIG. 9 is a cross-sectional, schematic view of multiple process layers formed above a semiconducting substrate with a protective process layer formed above certain of the process layers in certain regions of the wafer.

An alternative process flow for manufacturing multiple semiconductor devices will now be described. As shown in FIG. 9, the first layer of epitaxial aluminum oxide 21 and the first layer of epitaxial silicon 23 may be formed above the substrate 12. Thereafter, the substrate 12 may be removed from the processing equipment and a layer of photoresist (not shown) may be formed above the surface 37 of the first layer of epitaxial silicon 23. The layer of photoresist may then be patterned (using known techniques and processes) to, for example, expose the illustrative region 56 of the wafer 13 where the transistor 32 is to be formed. Thereafter, a protective layer 62 of, for example, silicon dioxide or silicon nitride, may be formed above the surface 37 of the first layer of epitaxial silicon 23 in the illustrated transistor region 56 of the wafer 13, as shown in FIG. 9. The remaining portion of the photoresist layer may then be removed, and the wafer 13 may be returned to the processing equipment where the second layer of epitaxial aluminum oxide 25 and the second layer of epitaxial silicon 27 are formed above the exposed surface 37 of the first layer of epitaxial silicon 23 in the memory device region 55. Of course, the epitaxial aluminum oxide and the epitaxial silicon will not grow above the protective layer 62 positioned in the transistor region 56 of the wafer 13. The resulting structure is shown in FIG. 9.

Figure 10:
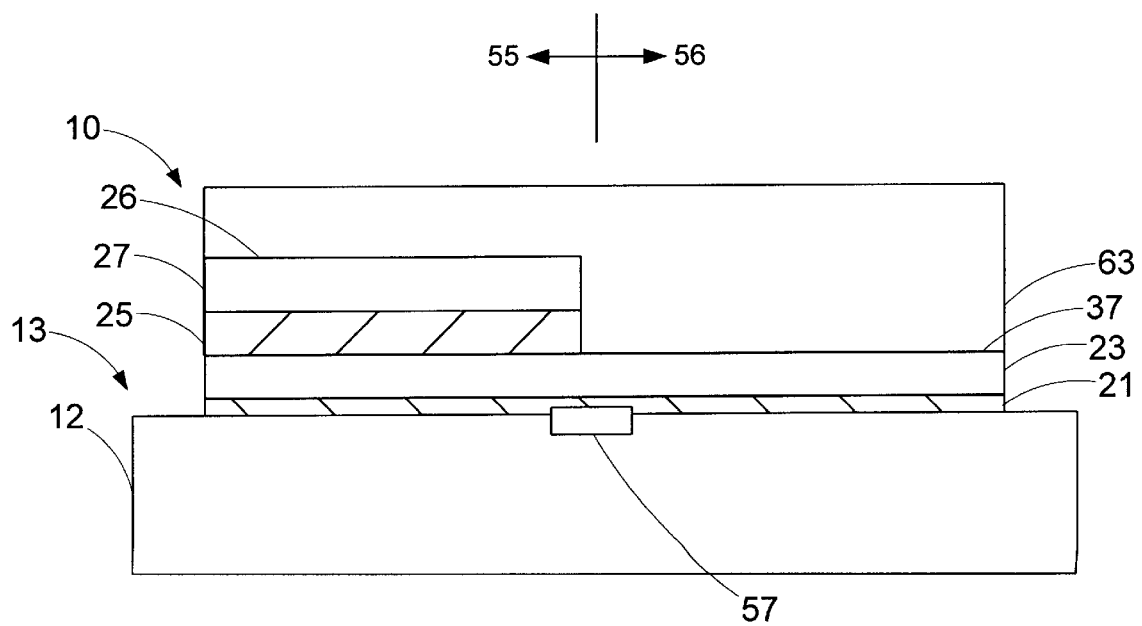
FIG. 10 is a cross-sectional, schematic view of the device shown in FIG. 9 with the protective layer removed and a conformal layer of photoresist formed above the remaining process layers.
Figure 11:
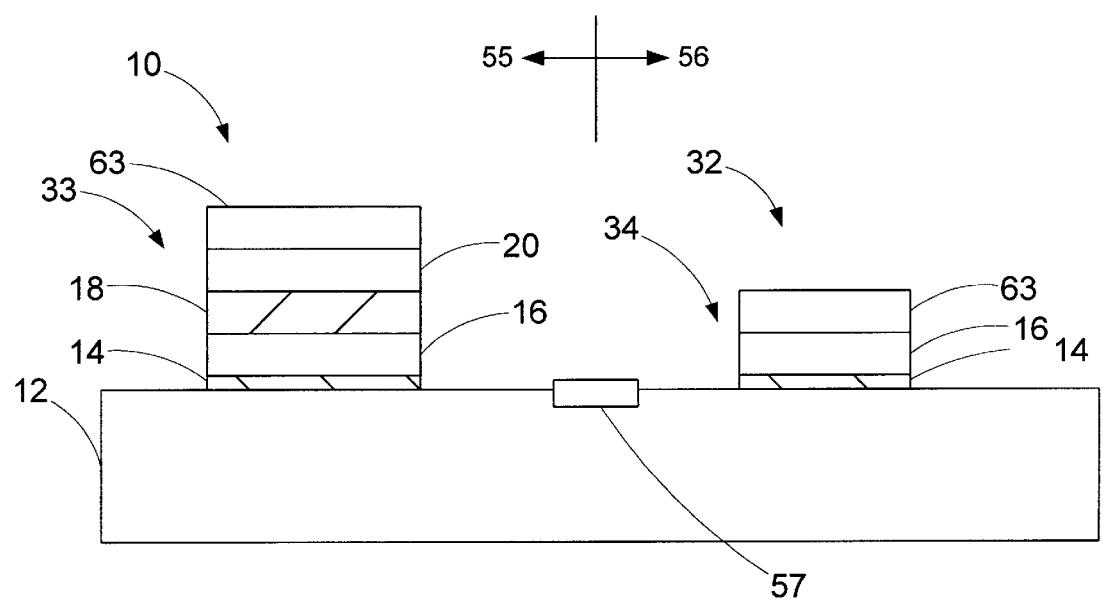
FIG. 11 is a cross-sectional, schematic view of a wafer with multiple partially-formed semiconductor devices positioned thereon.

The protective layer 62 may then be removed and, as shown in FIG. 10, a conformal layer of patterning material 63, e.g., photoresist, may then be formed above the surface 37 of the layer 23 and the surface 26 of the layer 27. The gate stacks 33, 34 of the illustrative memory device 10 and transistor 32, respectively, may then be formed by patterning the photoresist layer 63 and etching the appropriate layers 21, 23, 25 and 27 to result in the structure shown in FIG. 11. After this is accomplished, the sidewall spacers 22 and source/drain regions 24 may be formed.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a semiconducting substrate;
a layer of epitaxial substantially single crystalline metal oxide having a thickness ranging from approximately 10–30 Å positioned above said substrate;
a gate conductor positioned above said layer of epitaxial substantially single crystalline metal oxide; and
at least one source/drain region in the semiconductor substrate adjacent the layer of epitaxial substantially single crystalline metal oxide.

2. The semiconductor device of claim 1, wherein said layer of epitaxial substantially single crystalline metal oxide is comprised of epitaxial substantially single crystalline aluminum oxide.

3. The semiconductor device of claim 1, wherein said gate conductor is comprised of polysilicon.

4. The semiconductor device of claim 1, wherein said gate conductor is comprised of epitaxial substantially single crystalline silicon.

5. A semiconductor device, comprising:
a semiconducting substrate;
a layer of epitaxial metal oxide positioned adjacent said substrate;
a gate conductor positioned directly on said layer of epitaxial metal oxide without an intervening layer therebetween; and
at least one source/drain region in the semiconductor substrate adjacent the layer of epitaxial metal oxide, wherein said layer of epitaxial metal oxide is comprised of epitaxial yttrium sesquioxide.

6. A semiconductor device, comprising:
a semiconducting substrate;
a layer of epitaxial metal oxide positioned adjacent said substrate;
a gate conductor positioned above said layer of epitaxial metal oxide; and
at least one source/drain region in the semiconductor substrate adjacent the layer of epitaxial metal oxide wherein the layer of epitaxial metal oxide is comprised of epitaxial aluminum oxide, wherein said layer of epitaxial aluminum oxide has a thickness ranging from approximately 10–30 Å.

7. A semiconductor device, comprising:
a semiconducting substrate;
a layer of epitaxial metal oxide positioned adjacent said substrate;
a gate conductor positioned above said layer of epitaxial metal oxide; and
at least one source/drain region in the semiconductor substrate adjacent the layer of epitaxial metal oxide, further comprising:
a tunnel dielectric layer positioned above said gate conductor; and
a floating gate layer positioned above said tunnel dielectric layer.

8. A semiconductor device, comprising:
a semiconducting substrate;
a gate dielectric comprised of an epitaxial substantially single crystalline metal oxide having a thickness ranging from approximately 10–30 Å positioned above said substrate;
a gate conductor positioned above said gate dielectric; and
at least one source/drain region in the semiconductor substrate adjacent the gate dielectric.

9. The semiconductor device of claim 8, wherein said gate dielectric is comprised of epitaxial substantially single crystalline aluminum oxide.

10. The semiconductor device of claim 8, wherein said gate conductor is comprised of polysilicon.

11. The semiconductor device of claim 8, wherein said gate conductor is comprised of epitaxial substantially single crystalline silicon.

12. A semiconductor device, comprising:
a semiconducting substrate;
a gate dielectric comprised of an epitaxial metal oxide positioned adjacent said substrate;
a gate conductor positioned directly on said gate dielectric without an intervening layer therebetween; and
at least one source/drain region in the semiconductor substrate adjacent the gate dielectric, wherein said gate dielectric is comprised of epitaxial yttrium sesquioxide.

13. A semiconductor device, comprising:
a semiconducting substrate;
a gate dielectric comprised of an epitaxial metal oxide positioned adjacent said substrate;
a gate conductor positioned above said gate dielectric; and
at least one source/drain region in the semiconductor substrate adjacent the gate dielectric wherein the gate dielectric is comprised of epitaxial aluminum oxide, wherein said epitaxial aluminum oxide has a thickness ranging from approximately 10–30 Å.

14. A semiconductor device, comprising:
a semiconducting substrate;
a gate dielectric comprised of an epitaxial metal oxide positioned adjacent said substrate;
a gate conductor positioned above said gate dielectric; and
at least one source/drain ration in the semiconductor substrate adjacent the gate dielectric, further comprising:
a tunnel dielectric layer positioned above said gate conductor; and
a floating gate layer positioned above said tunnel dielectric layer.

15. A semiconductor device, comprising:
a semiconducting substrate;
a first layer of epitaxial substantially single crystalline metal oxide having a thickness ranging from approximately 10–30 Å positioned above said substrate;
a first layer of an epitaxial substantially single crystalline conductor positioned above said first layer of epitaxial substantially sinfully crystalline metal oxide; and
at least one source/drain region in the semiconductor substrate adjacent the first layer of epitaxial substantially single crystalline metal oxide.

16. The semiconductor device of claim 15, further comprising a plurality of sidewall spacers positioned adjacent said first layer of epitaxial substantially single crystalline metal oxide and said first layer of an epitaxial substantially single crystalline conductor.

17. The semiconductor device of claim 15, wherein said first layer of epitaxial substantially single crystalline metal oxide is comprised of epitaxial substantially single crystalline aluminum oxide.

18. The semiconductor device of claim 15, wherein said first layer of an epitaxial substantially single crystalline conductor is comprised of epitaxial substantially single crystalline silicon.

19. The semiconductor device of claim 15, wherein said first layer of an epitaxial substantially single crystalline conductor is comprised of epitaxial substantially single crystalline germanium.

20. The semiconductor device of claim 15, wherein said first layer of an epitaxial substantially single crystalline conductor has a thickness ranging from approximately 500–2000 Å.

21. The semiconductor device of claim 15, wherein said first layer of epitaxial substantially single crystalline metal oxide and said first layer of an epitaxial substantially single crystalline conductor are configured to form a field effect transistor.

22. A semiconductor device, comprising:
a semiconducting substrate;
a first layer of epitaxial metal oxide positioned above said substrate;
a first layer of an epitaxial conductor positioned above said first layer of epitaxial metal oxide; and
at least one source/drain region in the semiconductor substrate adjacent the first layer of epitaxial metal oxide, further comprising:
a second layer of epitaxial metal oxide positioned above said first layer of an epitaxial conductor; and
a second layer of an epitaxial conductor positioned above said second layer of epitaxial metal oxide.

23. The semiconductor device of claim 22, further comprising a plurality of sidewall spacers positioned adjacent said first and second layers of epitaxial metal oxide and said first and second layers of an epitaxial conductor.

24. The semiconductor device of claim 22, wherein said second layer of metal oxide is comprised of aluminum oxide.

25. The semiconductor device of claim 22, wherein said second layer of metal oxide is comprised of yttrium sesquioxide.

26. The semiconductor device of claim 25, wherein said second layer of an epitaxial conductor is comprised of epitaxial silicon.

27. The semiconductor device of claim 22, wherein said second layer of an epitaxial conductor is comprised of epitaxial germanium.

28. The semiconductor device of claim 22, wherein said second layer of epitaxial metal oxide has a thickness ranging from approximately 30–90 Å.

29. The semiconductor device of claim 22, wherein said second layer of an epitaxial conductor has a thickness ranging from approximately 500–2000 Å.

30. The semiconductor device of claim 22, wherein said first and second layers of epitaxial metal oxide and said first and second layers of an epitaxial conductor are configured to form a memory device.

31. A semiconductor device, comprising:
a semiconducting substrate;
a first layer of epitaxial metal oxide positioned above said substrate;
a first layer of an epitaxial conductor positioned directly on said first layer of epitaxial metal oxide without an intervening layer therebetween; and
at least one source/drain region in the semiconductor substrate adjacent the first layer of epitaxial metal oxide, wherein said first layer of epitaxial metal oxide is comprised of yttrium sesquioxide.

32. A semiconductor device, comprising:
a semiconducting substrate;
a first layer of epitaxial metal oxide positioned above said substrate;
a first layer of an epitaxial conductor positioned above said first layer of epitaxial metal oxide; and
at least one source/drain region in the semiconductor substrate adjacent the first layer of epitaxial metal oxide, wherein said first layer of epitaxial metal oxide has a thickness ranging from approximately 10–30 Å.

33. A transistor, comprising:
a semiconducting substrate;
a gate dielectric comprised of epitaxial substantially single crystalline aluminum oxide having a thickness ranging from approximately 10–30 Å positioned above said substrate;
a gate conductor comprised of epitaxial substantially single crystalline silicon positioned above said gate dielectric; and
at least one source/drain region in the semiconductor substrate adjacent the gate dielectric.

34. The transistor of claim 33, further comprising a plurality of sidewall spacers formed adjacent said gate dielectric and said gate conductor.

35. The transistor of claim 33, wherein said gate conductor has a thickness ranging from approximately 500–2000 Å.

36. The transistor of claim 33, wherein said gate conductor is doped with an $N^+$ dopant material.

37. The transistor of claim 33, wherein said gate conductor is doped with a $P^+$ dopant material.

38. A transistor, comprising:
a semiconducting substrate;
a gate dielectric comprised of epitaxial aluminum oxide positioned above said substrate,
a gate conductor comprised of epitaxial silicon positioned above said gate dielectric; and
at least one source/drain region in the semiconductor substrate adjacent the gate dielectric, wherein said gate dielectric has a thickness ranging from approximately 10–30 Å.

39. A memory device, comprising:
a semiconducting substrate;
a gate dielectric comprised of epitaxial aluminum oxide positioned above said substrate;
a gate conductor comprised of epitaxial silicon positioned above said gate dielectric;
a tunnel dielectric comprised of epitaxial aluminum oxide positioned above said gate conductor;
a floating gate comprised of epitaxial silicon positioned above said tunnel dielectric; and
at least one source/drain region in the semiconductor substrate adjacent the gate dielectric.

40. The memory device of claim 39, further comprising a plurality of sidewall spacers formed adjacent said gate dielectric, gate conductor, tunnel dielectric and floating gate.

41. The memory device of claim 39, wherein said gate dielectric has a thickness ranging form approximately 10–30 Å.

42. The memory device of claim 39, wherein said gate conductor has a thickness ranging from approximately 500–2000 Å.

43. The memory device of claim 39, wherein said tunnel dielectric has a thickness ranging from approximately 30–100 Å.

44. The memory device of claim 39, wherein said floating gate has a thickness ranging from approximately 500–2000 Å.

* * * * *